(12) United States Patent
Jeung et al.

(10) Patent No.: US 7,075,838 B2
(45) Date of Patent: Jul. 11, 2006

(54) SEMICONDUCTOR DEVICE AND TEST METHOD OF TESTING THE SAME

(75) Inventors: Seong-ho Jeung, Suwon (KR); Jong-hoon Jung, Yongin (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 111 days.

(21) Appl. No.: 10/756,715

(22) Filed: Jan. 13, 2004

(65) Prior Publication Data

US 2004/0246797 A1 Dec. 9, 2004

(30) Foreign Application Priority Data

Jun. 5, 2003 (KR) .................. 10-2003-0036333

(51) Int. Cl.
G11C 29/06 (2006.01)
G11C 29/50 (2006.01)
G11C 11/413 (2006.01)
G11C 8/08 (2006.01)

(52) U.S. Cl. ................. 365/201; 365/154; 365/189.11; 365/230.06

(58) Field of Classification Search ........... 365/189.11, 365/201, 230.06, 189.09, 154, 226

See application file for complete search history.

(56) References Cited

U.S. PATENT DOCUMENTS

| | | | | |
|---|---|---|---|---|
| 4,418,403 A | * | 11/1983 | O'Toole et al. ............. 365/201 |
| 5,265,056 A | * | 11/1993 | Butler et al. ................ 365/201 |
| 5,687,123 A | * | 11/1997 | Hidaka et al. ......... 365/189.09 |
| 5,687,178 A | * | 11/1997 | Herr et al. .................. 714/721 |
| 5,920,517 A | * | 7/1999 | Wendell ...................... 365/226 |
| 5,930,185 A | * | 7/1999 | Wendell ...................... 365/201 |
| 6,205,067 B1 | * | 3/2001 | Tsukude ..................... 365/201 |
| 2003/0007380 A1 | * | 1/2003 | Houston ..................... 365/154 |

FOREIGN PATENT DOCUMENTS

JP 7-240093 12/1995
KR P0165908 5/1995

* cited by examiner

Primary Examiner—Tuan T. Nguyen
Assistant Examiner—J. H. Hur
(74) Attorney, Agent, or Firm—F. Chau & Associates, LLC

(57) ABSTRACT

A semiconductor device and a method of testing the semiconductor device are provided. The semiconductor device includes a memory cell array, a sense amplifier, a control circuit, a row decoder, a bitline-pair voltage setting circuit, and a wordline driver. The memory cell array is connected to one of a plurality of wordlines and a plurality of bitline pairs. The memory cell array comprises a plurality of memory cells, wherein each memory cell is connected to one of the plurality of wordlines and the plurality of bitline pairs. The sense amplifier amplifies data read from the memory cell array. The control circuit controls writing/reading of data to/from the memory cell array. The row decoder decodes an address signal and outputs a decoded signal to select one of the plurality of wordlines. The bitline-pair voltage setting circuit sets the voltage of at least one of the plurality of bitline pairs to a bitline test voltage in a test mode. The wordline driver sets the low-level voltages of the plurality of wordlines to a wordline test voltage in the test mode. The wordline test voltage level can be set to be different from the low-level voltage of the plurality of wordlines in a normal operation mode.

13 Claims, 6 Drawing Sheets

FIG. 6

| VSSWLE/VSSWL0 | NORMAL | ASYMMETRICAL DEFECT | SYMMETRICAL DEFECT |
|---|---|---|---|
| 0 | PASS | PASS | PASS |
| 0.1 | PASS | PASS | PASS |
| 0.2 | PASS | PASS | PASS |
| 0.3 | PASS | PASS | PASS |
| 0.4 | PASS | PASS | PASS |
| 0.5 (SCREEN POINT) | PASS | < 320KΩ PASS | < 250KΩ PASS |
| 0.6 | PASS | < 80KΩ PASS | < 50KΩ PASS |
| 0.7 | PASS | < 20KΩ PASS | < 10KΩ PASS |
| 0.8 | FAIL | FAIL | FAIL |

SEMICONDUCTOR DEVICE AND TEST METHOD OF TESTING THE SAME

BACKGROUND OF THE INVENTION

1. Technical Field

The present invention relates to semiconductor devices, and more particularly, to a testing method capable of detecting latent defective memory cells in a semiconductor device on which the testing method is performed.

2. Discussion of the Related Art

A semiconductor device having a plurality of memory cells cannot function properly if one of the memory cells is defective. Accordingly, various testing methods have been developed to detect defective memory cells.

Defective memory cells include defects that are easily detected because, for example, they malfunction upon testing and defects that are not as easily detected upon testing because they are latent. Memory cells that have latent defects are called "weak cells" because they function properly at present but are likely to have defects after prolonged use.

If semiconductor devices are tested to detect weak cells before they are provided to users, their reliability can be increased. One method of testing a semiconductor device to detect week cells is disclosed in U.S. Pat. No. 5,920,517, issued Jul. 6, 1999, entitled "Memory Array Test And Characterization Using Isolated Memory Cell Power Supply."

Since tests for detecting weak cells are typically time consuming, methods to reduce the test time are desired because the test time directly relates to the cost of the test and to the cost of producing a product.

SUMMARY OF THE INVENTION

The present invention provides a semiconductor device having an improved reliability by effectively detecting latent defective memory cells, and a semiconductor device testing method that reduces testing duration.

According to a first aspect of the present invention, there is provided a semiconductor device, which includes a memory cell array, a sense amplifier, a control circuit, a row decoder, a bitline-pair voltage setting circuit, and a wordline driver. The memory cell array includes a plurality of memory cells, each of which is connected to one of a plurality of wordlines and one of a plurality of bitline pairs. The sense amplifier amplifies data read from the memory cell array. The control circuit controls writing/reading of data to/from the memory cell array. The row decoder decodes an address signal and outputs a decoded signal to select one of the plurality of wordlines. The bitline-pair voltage setting circuit sets the voltage of at least one pair of the plurality of bitline pairs to a bitline test voltage in a test mode. The wordline driver sets the low-level voltages of the plurality of wordlines to a wordline test voltage in the test mode. The wordline test voltage can be set to be different from the low-level voltage of the plurality of wordlines in a normal operation mode.

The low-level voltage of the wordlines in the normal operation mode is a ground voltage.

The semiconductor device further includes a wordline test voltage terminal for receiving the wordline test voltage, and the wordline test voltage terminal is separate from a ground voltage terminal, which receives the ground voltage.

According to another aspect of the present invention, there is provided a semiconductor device, which includes a memory cell array, a row decoder, an odd wordline driver, and an even wordline driver. The memory cell array includes a plurality of memory cells, each of which is connected to one of a plurality of wordlines and a plurality of bitline pairs. The row decoder decodes an address signal and outputs a decoded signal to select one of the plurality of wordlines. The odd wordline driver sets the low-level voltages of odd wordlines in one group among the plurality of wordlines to an odd low-level voltage in a test mode. The even wordline driver sets the low-level voltages of even wordlines in the other group among the plurality of wordlines to an even low-level voltage in the test mode. Both the odd low-level voltage and the even low-level voltage can be set to be different from the low-level voltages of the plurality of wordlines set in a normal operation mode.

The semiconductor device further includes a bitline pair voltage setting circuit, which sets the voltage of at least one pair of the plurality of bitline pairs to a bitline test voltage level.

According to yet another aspect of the present invention, there is provided a method of testing a semiconductor device, the semiconductor device including memory cells. Each of the memory cells is connected to one of a plurality of wordlines and a plurality of bitline pairs. In this method, test data is written to the memory cells. Next, the low-level voltage of the plurality of wordlines is set to a wordline test voltage. Thereafter, the voltage of at least one of the plurality of bitline pairs is set to a true test voltage and a complementary test voltage. Then, the plurality of wordlines stand by in an activated state for a period of time. Next, data is read from the memory cells. Then, the read-out data is compared with the written test data. The wordline test voltage can be set independently of the low-level voltage of the plurality of wordlines set in a normal operation mode.

According to another aspect of the present invention, there is provided a method of testing a semiconductor device, which includes memory cells. Each of the memory cells is connected to one of a plurality of wordlines and a plurality of bitline pairs. In this method, test data is written to the memory cells. Then, the low-level voltage of the plurality of wordlines is set to a wordline test voltage. Thereafter, a wordline is selected from the plurality of wordlines, and the selected wordline is activated. Next, data opposite to the test data is written to memory cells connected to the selected wordline, for a period of time. Then, data is read from the memory cells other than the memory cells containing the data. The read-out data is compared with the written test data. The wordline test voltage can be set independently of the low-level voltage of the plurality of wordlines set in a normal operation mode.

BRIEF DESCRIPTION OF THE DRAWINGS

The above features of the present invention will become more apparent by describing in detail exemplary embodiments thereof with reference to the attached drawings, in which:

FIG. 6 is a table showing the results of an experiment performed on the semiconductor device of FIG. 3.

DETAILED DESCRIPTION OF EXEMPLARY EMBODIMENTS

Figure 1:
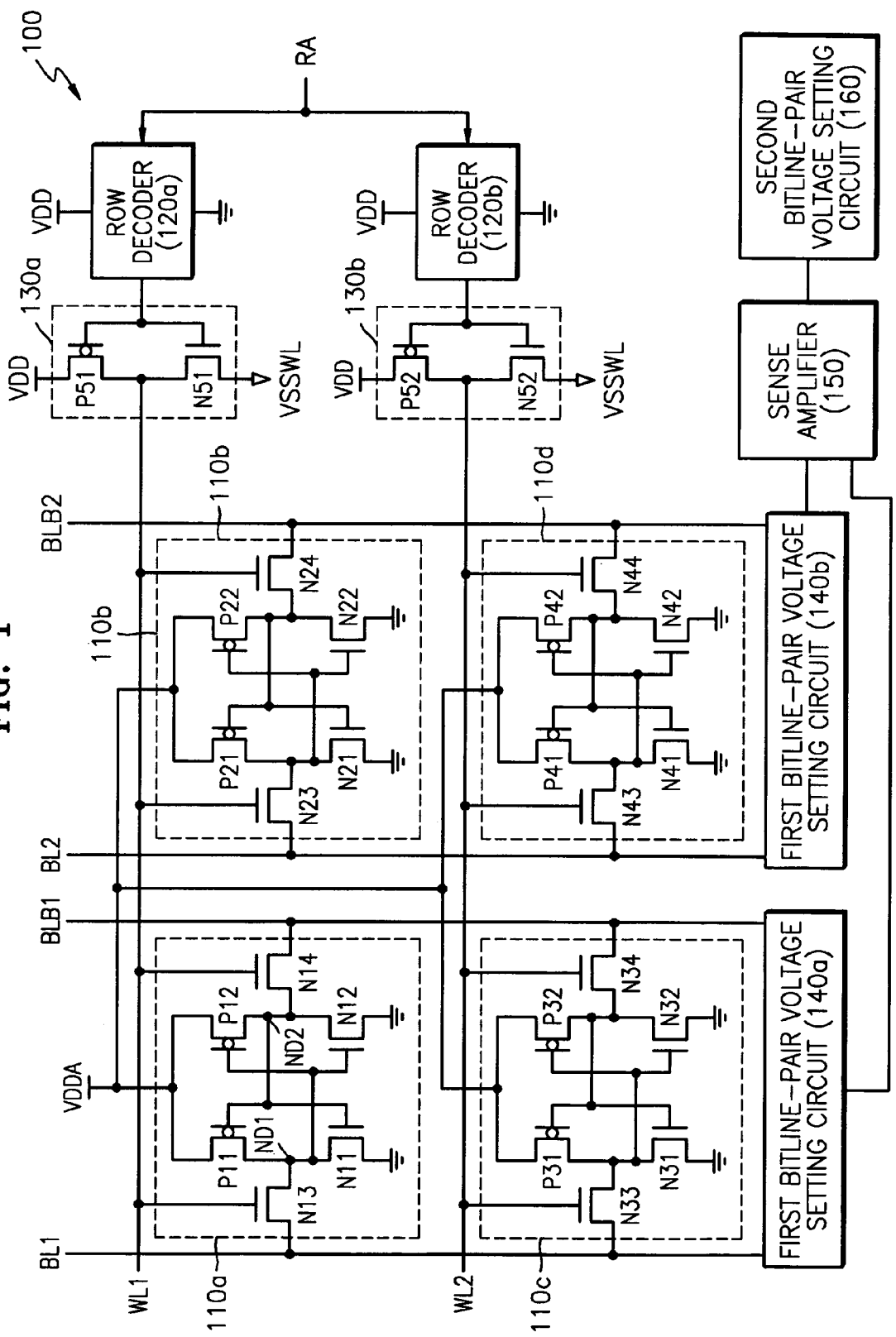
FIG. 1 is a circuit diagram of a semiconductor device according to an exemplary embodiment of the present invention.

Referring to FIG. 1, a semiconductor device 100 according to an exemplary embodiment of the present invention is, for example, a static random access memory (SRAM), and includes a memory cell array, row decoders 120a and 120b, word line drivers 130a and 130b, first bitline-pair voltage setting circuits 140a and 140b, a sense amplifier 150, and a second bitline-pair voltage setting circuit 160.

The memory cell array includes a plurality of memory cells 110a–d, each of which is connected to one of the bitline pairs BL1, BLB1 and BL2, BLB2 and one of the wordlines WL1 and WL2. Although FIG. 1 shows two wordlines WL1 and WL2, two bitline pairs BL1, BLB1 and BL2, BLB2, and four memory cells 110a–d, it is to be understood that the embodiment shown in FIG. 1 can be modified to include additional wordlines, wordline drivers, bitline pairs, bitline-pair voltage setting circuits, memory cells, row decoders, and amplifiers.

Each of the memory cells 110a–d includes six transistors. Memory cell 110a includes negative-channel metal oxide semiconductor (NMOS) transistors N11 and N12, access transistors N13 and N14, and positive-channel metal oxide semiconductor (PMOS) transistors P11 and P12. Memory cell 110b includes NMOS transistors N21 and N22, access transistors N23 and N24, and PMOS transistors P21 and P22. Memory cell 110c includes NMOS transistors N31 and N32, access transistors N33 and N34, and PMOS transistors P31 and P32. Memory cell 110d includes NMOS transistors N41 and N42, access transistors N43 and N44, and PMOS transistors P41 and P42. Since the memory cells 110a–d have the same structure, the following description will focus on the memory cell 110a without independently describing memory cells 110b–d in order to avoid repetition. It is to be understood, however, that the following description of memory cell 110a is applicable to the memory cells 110b–d.

As shown in FIG. 1, the access transistors N13 and N14 are turned on/off according to a voltage level of the first wordline WL1. A first node ND1, which stores true data, is connected to a true bitline BL1 via the access transistor N13. A second node ND2, which stores complementary data, is connected to a complementary bitline BLB1 via the access transistor N14. If the access transistors N13 and N14 are turned on, the first node ND1 shares charges with the true bitline BL1, and the second node ND2 shares charges with the complementary bitline BLB1. The PMOS transistor P11 is formed between a cell array voltage VDDA and the first node ND1, and the PMOS transistor P12 is formed between the cell array voltage VDDA and the second node ND2. The NMOS transistor N11 is formed between the first node ND1 and a ground voltage, and the NMOS transistor N12 is formed between the second node ND2 and a ground voltage.

As further shown in FIG. 1, the row decoders 120a and 120b decode a row address RA to select one of the wordlines WL1 and WL2. The selected wordline is activated with a predetermined high-level voltage VDD by a PMOS transistor P51 or P52 of the wordline driver 130a or 130b, respectively. The unselected wordline is set to a predetermined low-level voltage VSSWL by an NMOS transistor N51 or N52 of the wordline driver 130a or 130b, respectively. The low-level voltage VSSWL serves as a predetermined wordline test voltage in a test mode and as a ground voltage in a normal operation mode. The wordline test voltage can be set independently of the ground voltage.

Typically, the low-level voltage VSSWL of a wordline has a ground voltage level that is the same in both a test mode and a normal operation mode. However, in the present invention, the levels of the low-level voltage VSSWL of a wordline, for example, WL1 and WL2, in a test mode and in a normal operation mode can be set differently.

To do this, the semiconductor device 100 further includes a wordline test voltage terminal for receiving a wordline test voltage. The wordline test voltage terminal is installed separately from a ground voltage terminal for receiving a ground voltage. The voltage terminals can receive an external signal from test equipment when: (1) the semiconductor device 100 is not packaged (e.g., when the semiconductor device 100 is in a wafer state), and (2) when the semiconductor device 100 is packaged (e.g., when the semiconductor device 100 is connected to an external device via pins). In addition, the pins, which connect the semiconductor device 100 to external devices, include a test voltage pin separate from a ground voltage pin in order to perform a test according to the present invention even after the semiconductor device 100 has been packaged. In this case, the ground voltage terminal and the wordline test voltage terminal are connected to the ground voltage pin and the wordline test voltage pin, respectively. If the test according to the present invention is not required after the semiconductor device 100 has been packaged, the wordline test voltage pin does not have to be installed separately from the ground voltage pin. In this case, the ground voltage terminal and the wordline test voltage terminal are both connected to the ground voltage pin. Connecting units other than the pins, for example, balls, can also be used.

In the test mode of the semiconductor device 100, the wordline test voltage is received from external test equipment. The level of the wordline test voltage can vary. The wordline low-level voltage VSSWL in the test mode, that is, the wordline test voltage, is set higher than the wordline low-level voltage (ground voltage) in the normal operation mode.

Each of the first bitline-pair voltage setting circuits 140a and 140b set the voltage levels of a true bitline and a complementary bitline to a true test voltage level and a complementary test voltage level, respectively. In the test mode, the first bitline-pair voltage setting circuit 140a sets the voltage levels of a pair of bitlines BL1 and BLB1, and the first bitline-pair voltage setting circuit 140b sets the voltage levels of a pair of bitlines BL2 and BLB2. The voltage levels of a pair of bitlines can be determined by the second bitline-pair voltage setting circuit 160.

The second bitline-pair voltage setting circuit 160 does not have to be installed for each bitline pair as the first bitline-pair voltage setting circuits 140a and 140b. The second bitline-pair voltage setting circuit 160 is included in a write driver (not shown) or may be separate from the write driver. In response to external data, the write driver drives the voltage levels of a bitline pair corresponding to a column address to a predetermined voltage level. The second bitline-pair voltage setting circuit 160 drives the write driver to respond to predetermined test data instead of external data and sets the voltage levels of a selected bitline pair to a true test voltage level and a complementary test voltage level, respectively. Compared to the first bitline-pair voltage setting circuits 140a and 140b, only one second bitline-pair voltage setting circuit 160 is included in the memory cell array, thereby reducing the size of the semiconductor device 100. However, the second bitline-pair voltage setting circuit 160 cannot set the voltage levels of several bitline pairs at a time, thus increasing the time required for testing.

As described above, since the first bitline-pair voltage setting circuits 140a and 140b play a similar role to the second bitline-pair voltage setting circuit 160, both the first and second circuits 140a and 140b do not have to be included in the semiconductor device 100. Hence, the semiconductor device 100 can include only the first bitline-pair voltage setting circuits 140a and 140b, only the second bitline-pair voltage setting circuit 160, or both the first and second bitline-pair voltage setting circuits 140a, 140b and 160.

The sense amplifier 150 amplifies data read from the memory cell array. Although not shown in FIG. 1, the semiconductor device 100 further includes control circuits for controlling data writing and data reading to/from the memory cell array. For example, the semiconductor device 100 further includes a command word decoder, a buffer, and a clock signal generation circuit.

Referring back to the memory cell 110a, although the access transistors N13 and N14 between the true bitline BL1 and the first node ND1 and between the complementary bitline BLB1 and the second node ND2, respectively, are turned off, a small leakage current exists. The leakage current can increase as the low-level voltage VSSWL of the wordline WL1 increases. Hence, the wordline driver 130a can form a condition in which a stress is applied to the memory cell 110a, by varying the low-level voltage VSSWL of the wordline WL1. When the voltage levels of the true bitline BL1 and the complementary bitline BLB1 are set opposite those of the first and second nodes ND1 and ND2, the memory cell 110a is further stressed. As described above, the voltage levels of the true bitline BL1 and the complementary bitline BLB1 can be set by the first bitline-pair voltage setting circuits 140a and 140b and/or the second bitline-pair voltage setting circuit 160.

The case when the true data of the memory cell 110a is 0 and complementary data is 1, that is, when the first and second nodes ND1 and ND2 are 0 and 1, respectively, will now be described.

In this case, if the voltage level of the true bitline BL1 is set to VDD (which is 1) and the voltage level of the complementary bitline BLB1 is set to a ground voltage level (which is 0), a leakage current causes the charges of the true bitline BL1 to flow into the first node ND1 and the charges of the second node ND2 to flow out of the memory cell 110a and flow toward the complementary bitline BLB1. The number of charges flowing in/out increases as the low-level voltage VSSWL of the wordline WL1 increases. In other words, as the low-level voltage VSSWL of the wordline WL1 increases, the stress applied to the first and second nodes ND1 and ND2 increases. When a stress is applied to the first and second nodes ND1 and ND2, the voltage levels thereof may change, and accordingly, data stored in the memory cell 110a may be changed. Thus, data errors may occur. A memory cell having an error under a predetermined stress is highly likely to become a defective cell if the cell is used for a long time. Hence, these memory cells can be treated as weak cells.

In addition to varying the low-level voltage VSSWL of a wordline, by varying the voltage level of a voltage supplied to the memory cell array, that is, a cell array voltage VDDA, the stress applied to a memory cell can be accelerated. If a cell array voltage VDDA in a predetermined test mode is set lower than a cell array voltage VDDA in a normal operation mode, it is difficult for that memory cell to maintain a data of 1.

Figure 2:
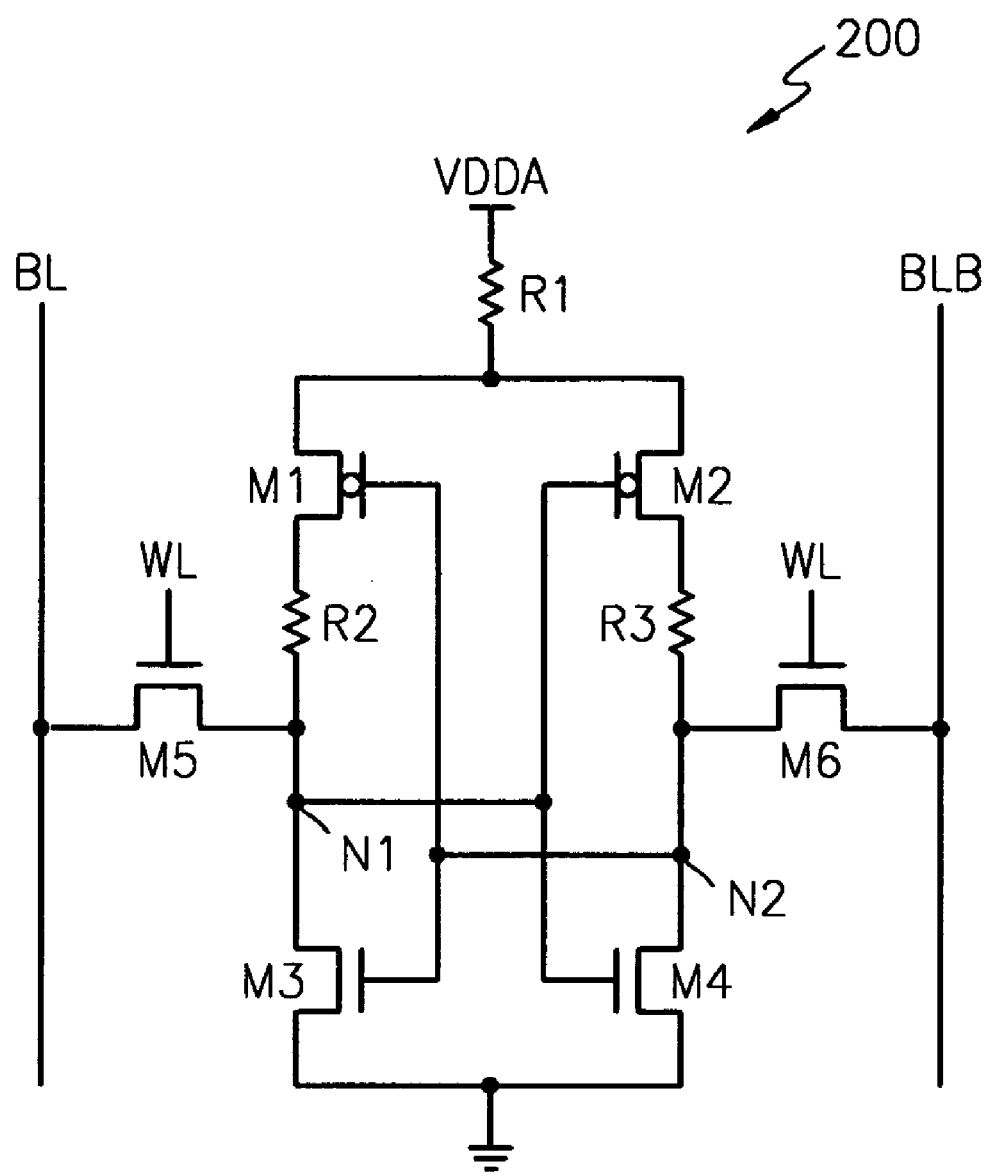
FIG. 2 shows several types of weak cells that can be detected from the semiconductor device of FIG. 1.

FIG. 2 is a circuit diagram of a SRAM memory cell 200, which shows several types of weak cells that can be detected from the semiconductor device 100 of FIG. 1 with a test. Referring to FIG. 2, the SRAM memory cell 200 has the same structure as the memory cells 110a–d of FIG. 1 except a first, second, and third resistances R1, R2, and R3 are installed between a cell array voltage VDDA and a pair of PMOS transistors M1 and M2, between the PMOS transistor M1 and a first node N1, and between the PMOS transistor M2 and a second node N2, respectively. The first, second, and third resistances R1, R2, and R3 represent open defects. The first resistance R1 represents a connection defect between the cell array voltage VDDA and the pair of PMOS transistors M1 and M2. When the value of the first resistance R1 is very high, the PMOS transistors M1 and M2 appear separated from the cell array voltage VDDA. In this case, setting the first and second nodes N1 and N2 to have the cell array voltage VDDA is difficult. Hence, data of 1 is not properly written to the first or second node N1 and N2. Because the first resistance R1 affects both the first and second nodes N1 and N2, it also represents a symmetrical defect.

The second resistance R2 represents a connection defect between the PMOS transistor M1 and the first node N1, and the third resistance R3 represents a connection defect between the PMOS transistor M2 and the second node N2. When the second resistance R2 is high, data of 1 may not be properly written to the first node N1. When the third resistance R3 is high, data of 1 may not be properly written to the second node N2. Compared to the first resistance R1, the second and third resistances R2 and R3 affect either the first node N1 or the second node N2 and, they represent asymmetrical defects.

The present invention can be applied to detect weak cells due to not only connection defects (i.e., open defects) of the drains of the PMOS transistors M1 and M2 of FIG. 2 but also to open defects of the gates of the PMOS transistors M1 and M2 or other factors.

Figure 3:
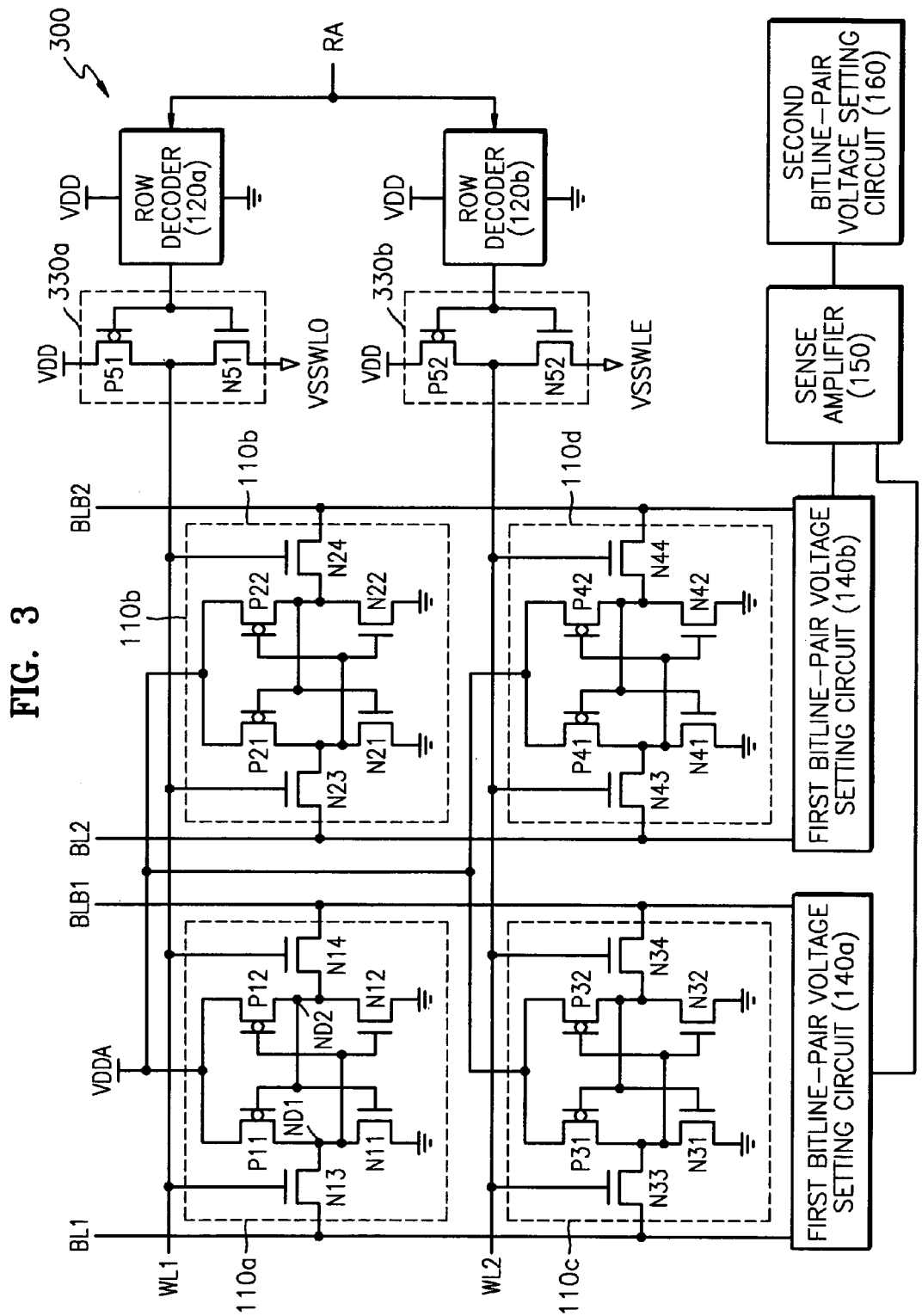
FIG. 3 is a circuit diagram of a semiconductor device according to another exemplary embodiment of the present invention.

FIG. 3 is a circuit diagram of a semiconductor device 300 according to another exemplary embodiment of the present invention. The semiconductor device 300 has the same structure as the semiconductor device 100 of FIG. 1 except, as illustrated by FIG. 3, different types of low-level voltages are applied to odd and even wordline drivers 330a and 330b, respectively.

Referring to FIG. 3, the odd wordline driver 330a is connected to an odd low-level voltage VSSWLO, and the even wordline driver 330b is connected to an even low-level voltage VSSWLE. The odd and even wordline drivers 330a and 330b are independent from each other. To achieve this, the semiconductor device 300 includes an odd low-level voltage terminal for receiving the odd low-level voltage VSSWLO and an even low-level voltage terminal for receiving the even low-level voltage VSSWLE. The odd low-level voltage terminal and the even low-level voltage terminal can be connected to a ground voltage pin as described above in relation to FIG. 1. Alternatively, the odd low-level voltage terminal and the even low-level voltage terminal can be connected to an odd low-level voltage pin and an even low-level voltage pin, respectively.

For convenience, the wordlines WL1 and WL2 are classified as odd wordlines and even wordlines. Odd wordlines alternate with even wordlines. In FIG. 3, the wordline WL1 is an odd wordline, and the wordline WL2 is an even wordline. The odd wordline WL1 is connected to the odd wordline driver 330a, and the odd wordline WL2 is connected to the even wordline driver 330b.

It is to be understood that the semiconductor device 100 of FIG. 1 is desirable when test data written to all memory cells is identical as in background data. However, when test data written to memory cells connected to the even wordlines is different from that written to memory cells connected to the odd wordlines as in a check board pattern, the semiconductor device 300 of FIG. 3 is desirable.

Figure 4:
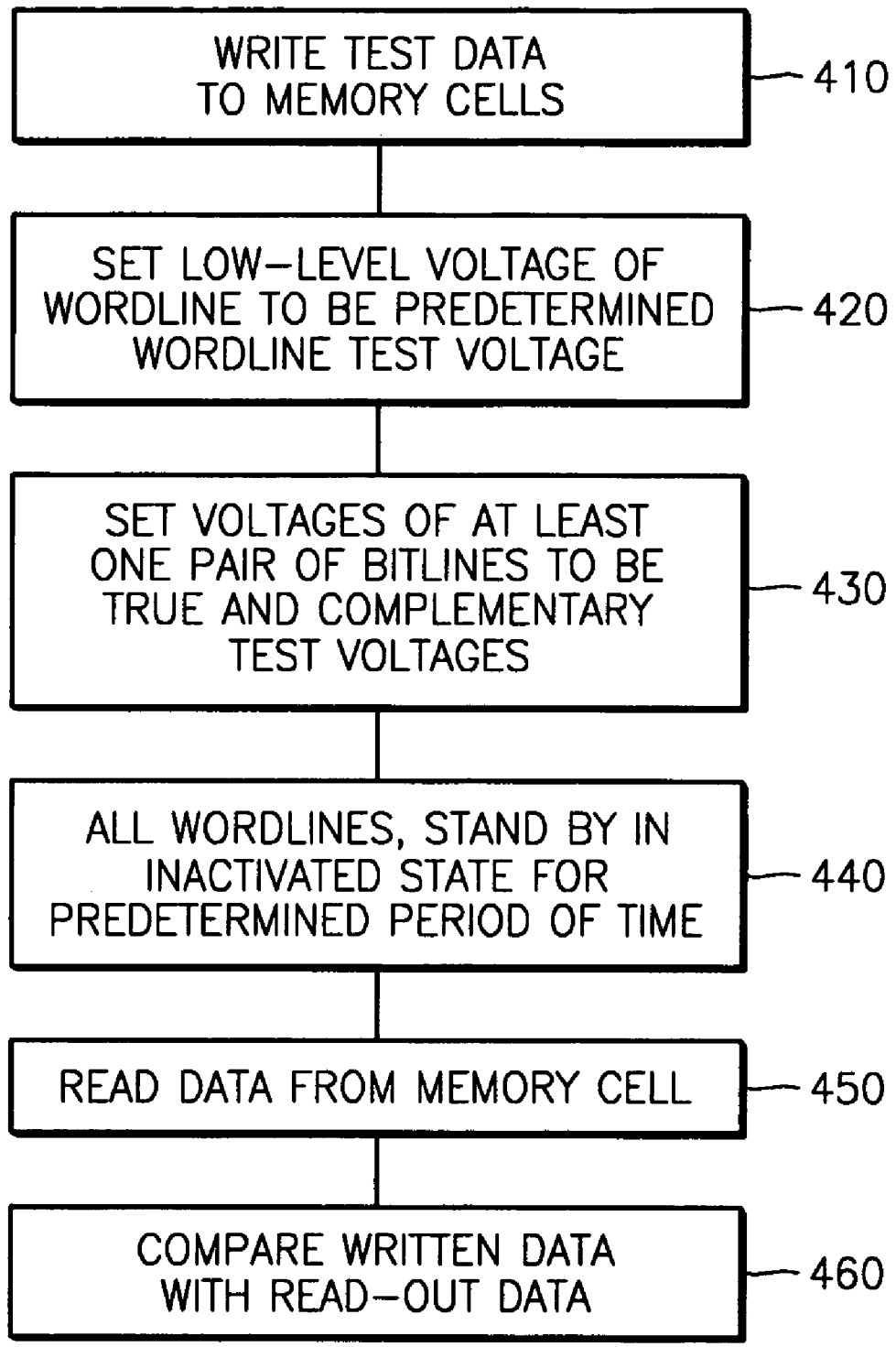
FIG. 4 is a flowchart illustrating a testing method according to an exemplary embodiment of the present invention.

FIG. 4 is a flowchart illustrating a testing method according to an exemplary embodiment of the present invention. It is to be understood that if the odd low-level voltage VSSWLO and the even low-level voltage VSSWLE in FIG. 3 are set to the same level, FIG. 3 is the same as FIG. 1. Hence, the testing method according to an embodiment of the present invention will now be described with reference to FIG. 3.

In step 410, test data is written to the memory cell array including the memory cells 110a–d. The test data can be background data with one level (e.g., 0 or 1) or it can be a check board pattern. If the test data is background data, all wordlines are activated to a high level by adjusting the odd low-level voltage VSSWLO and the even low-level voltage VSSWLE to a level close to a power supply voltage VDD. Then, access transistors connected to the wordlines WL1 and WL2 are simultaneously turned on and, the time required to write data can be reduced. If the test data is a check board pattern, odd wordlines are simultaneously activated by adjusting the odd low-level voltage VSSWLO to a level close to a power supply voltage VDD, and the check board pattern is written. Even wordlines are simultaneously activated by adjusting the even low-level voltage VSSWLE to a level close to a power supply voltage VDD, and the check board pattern is written. Thus, the time required to write data can be reduced. Hence, the total testing duration can be reduced.

In step 420, a low-level voltage of a wordline is set to a predetermined wordline test voltage. If the test data is background data, both the odd low-level voltage VSSWLO and the even low-level voltage VSSWLE are set to a voltage higher than a ground voltage, for example, 0.5V. If the test data is background data, both the odd low-level voltage VSSWLO and the even low-level voltage VSSWLE are set to different levels.

In step 430, the voltages of at least one pair of bitlines are set to a predetermined bitline-pair test voltage, that is, a true test voltage and a complementary test voltage, respectively. As described above in relation to FIG. 2, the true test voltage and the complementary test voltage are set to voltages opposite to the values of test data. If background data of 0 is written to the memory cells 110a–d, true data is 0 and complementary data is 1. In this case, the true bitlines BL1 and BL2 are set to 1, and the complementary bitlines BLB1 and BLB2 are set to 0. In the opposite case, the true bitlines BL1 and BL2 are set to 0, and the complementary bitlines BLB1 and BLB2 are set to 1. To detect weak cells having open defects as discussed in FIG. 2, the bitline pair is set to 0 when the background data is 0 or 1. Alternatively, a check board pattern of 0 can be written to the memory cell 110b, and a check board pattern of 1 can be written to the memory cell 110a. In this case, if the true bitline BL1 and the complementary bitline BLB1 are set opposite the data (true data of 0) of the memory cell 110b, a stress is applied to the memory cell 110b. Under these conditions, however, the memory cell 110a can form a favorable condition. Hence, in step 420, the even low-level voltage VSSWLE is set higher than a ground voltage, for example, to be 0.5V, and the odd low-level voltage VSSWLO is set less than or equal to a ground voltage, for example, to be 0V or –0.5V.

Thereafter, in step 440, all wordlines stand by in an inactivated state, that is, in an unselected state for a predetermined period of time. In step 450, data is read from the memory cells 110a–d. In step 460, the read data is compared with written data to check if they are identical. If the read data and the written data are not identical, a memory cell corresponding to the read and written data can be classified as a weak cell.

Figure 5:
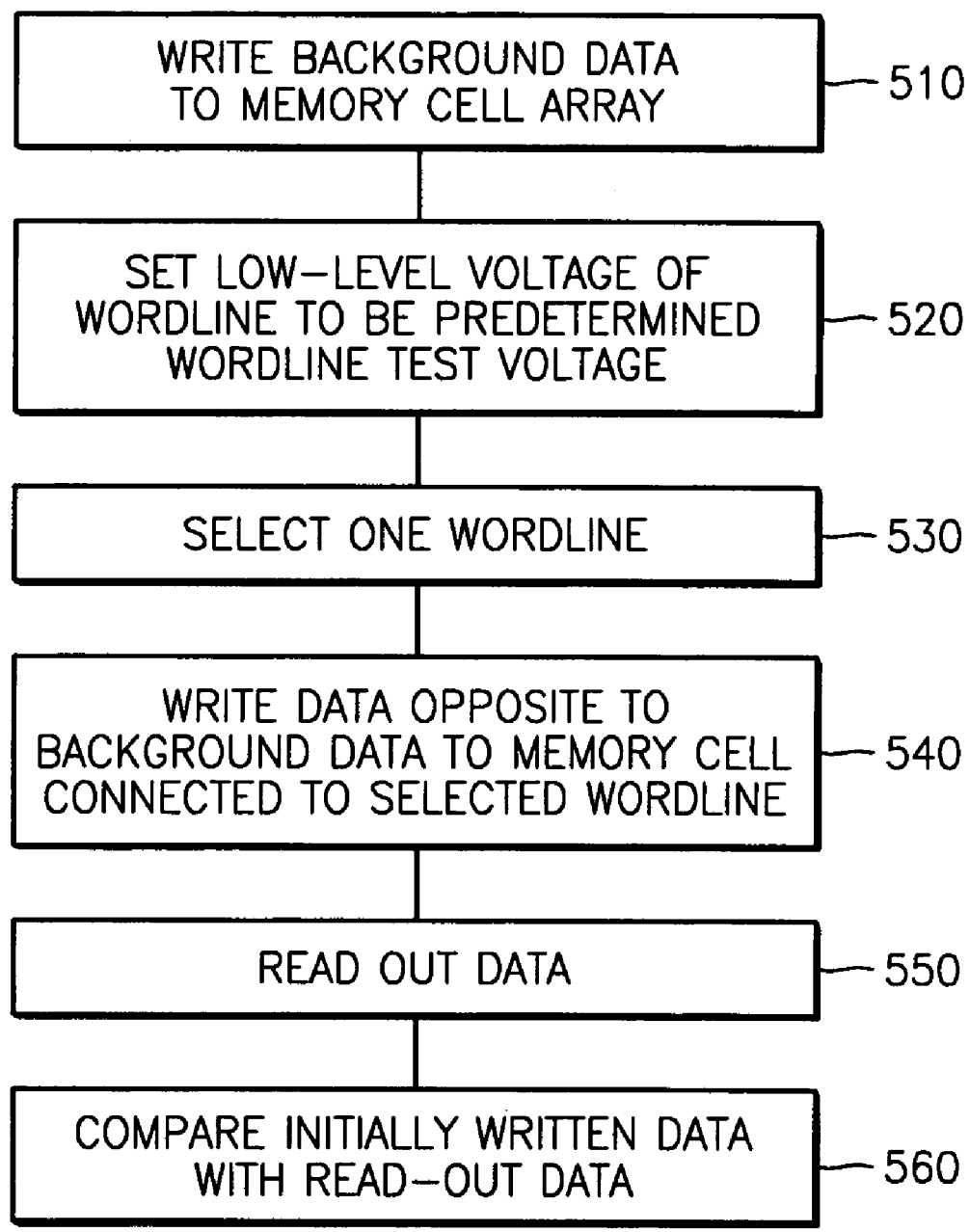
FIG. 5 is a flowchart illustrating a testing method according to another exemplary embodiment of the present invention.

FIG. 5 is a flowchart illustrating a testing method according to another exemplary embodiment of the present invention. This testing method will now be described with reference to FIG. 3.

In step 510, background data of 0 or 1 is written to the memory cell array including the memory cells 110a–d. At this time, both the odd low-level voltage VSSWLO and the even low-level voltage VSSWLE can be adjusted to a level close to a power supply voltage VDD, thereby reducing the time required to write data.

In step 520, a low-level voltage of a wordline is set to a predetermined wordline test voltage. Both the odd low-level voltage VSSWLO and the even low-level voltage VSSWLE are set to a voltage higher than a ground voltage, for example, 0.5V.

In step 530, a wordline is selected and activated. In step 540, data opposite the background data written in step 510 is written to the memory cell connected to the selected wordline, for a predetermined period of time. When the data opposite the background data is driven to a pair of bitlines, it acts as a considerable stress upon the memory cells connected to the wordlines other than the selected wordline.

In step 550, data is read from the memory cells that do not contain data opposite the background data. In step 560, the read data is compared to initially written data (i.e., background data) to check if they are identical. If the read data and the initially written data are not identical, the memory cell corresponding to them can be classified as a weak cell.

FIG. 6 is a table showing the results of an experiment performed on the semiconductor device 300 of FIG. 3. In the experiment, the odd low-level voltage VSSWLO and the even low-level voltage VSSWLE were controlled at intervals of 0.1V in the range of 0V to 0.8V. In this case, normal memory cells became "FAIL" when the odd low-level voltage VSSWLO and the even low-level voltage VSSWLE reached to 0.8V. Memory cells with asymmetrical defects as illustrated by the second and third resistances R2 and R3 of FIG. 2 became "FAIL" at the odd low-level voltage VSSWLO and the even low-level voltage VSSWLE of 0.7V when the second or third resistances R2 or R3 were less than 20 kΩ. The memory cells with asymmetrical defects became "FAIL" at the odd low-level voltage VSSWLO and the even low-level voltage VSSWLE of 0.6V when the second or third resistances R2 or R3 were no less than 20 kΩ and less than 80 kΩ. The memory cells with asymmetrical defects became "FAIL" at the odd low-level voltage VSSWLO and the even low-level voltage VSSWLE of 0.5V when the second or third resistances R2 or R3 were no less than 80 kΩ and less than 320 kΩ. Memory cells with symmetrical defects as illustrated by the first resistance R1 of FIG. 2 became "FAIL" at the odd low-level voltage VSSWLO and the even low-level voltage VSSWLE of 0.7V when the first resistance R1 was less than 10 kΩ. The memory cells with symmetrical defects became "FAIL" at the odd low-level voltage VSSWLO and the even low-level voltage VSSWLE of 0.6V when the first resistance R1 was no less than 10 kΩ and less than 50 kΩ. The memory cells with symmetrical defects became "FAIL" at the odd low-level voltage VSSWLO and the even low-level voltage VSSWLE of 0.5V when the first resistance R1 was no less than 50 kΩ and less than 250 kΩ. As shown in FIG. 6, when the odd low-level voltage VSSWLO and the even low-level voltage VSSWLE were set to be 0.5V, a cell having a defect could be determined as a weak cell.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A semiconductor device comprising:
   a memory cell array connected to one of a plurality of wordlines and a plurality of bitline pairs;
   a sense amplifier amplifying data read from the memory cell array;
   a control circuit controlling writing/reading of data to/from the memory cell array;
   a row decoder decoding an address signal and outputting a decoded signal to select one of the plurality of wordlines;
   a bitline-pair voltage setting circuit setting a voltage of at least one of the plurality of bitline pairs to a bitline test voltage in a test mode; and
   a wordline driver setting low-level voltages of the plurality of wordlines to a wordline test voltage in the test mode,
   wherein the wordline test voltage can be set to be different from the low-level voltages of the plurality of wordlines in a normal operation mode,
   wherein the wordline driver comprises: an odd wordline driver connected to an odd wordline; and an even wordline driver connected to an even wordline,
   wherein the odd wordline driver and the even wordline driver can independently set the low-level voltages of the odd wordline and the even wordline, respectively, in the test mode.

2. The semiconductor device of claim 1, wherein the low-level voltage of the wordlines in the normal operation mode is a ground voltage.

3. The semiconductor device of claim 2, further comprising a wordline test voltage terminal receiving the wordline test voltage, wherein the wordline test voltage terminal is separate from a ground voltage terminal, which receives the ground voltage.

4. The semiconductor device of claim 3, further comprising: a ground voltage connection unit connected to the ground voltage terminal; and a wordline test voltage connection unit connected to the wordline test voltage terminal.

5. The semiconductor device of claim 3, further comprising a ground voltage connection unit connected to the ground voltage terminal and the wordline test voltage terminal upon packaging of the semiconductor device.

6. The semiconductor device of claim 1, wherein the odd wordline alternates with the even wordline.

7. The semiconductor device of claim 1, wherein the memory cell array comprises:
   a plurality of memory cells, wherein each memory cell is connected to one of the plurality of wordlines and the plurality of bitline pairs.

8. A semiconductor device comprising:
   a memory cell array including a plurality of memory cells, each memory cell connected to one of a plurality of wordlines and a plurality of bitline pairs;
   a row decoder decoding an address signal and outputs a decoded signal to select one of the plurality of wordlines;
   an odd wordline driver setting low-level voltages of odd wordlines to an odd low-level voltage in a test mode;
   an even wordline driver setting low-level voltages of even wordlines to an even low-level voltage in the test mode,
   wherein both the odd low-level voltage and the even low-level voltage can be set to be different from low-level voltages of the plurality of wordlines set in a normal operation mode,
   an odd low-level voltage terminal receiving the odd low-level voltage; and
   an even low-level voltage terminal receiving the even low-level voltage, wherein the odd low-level voltage terminal and the even low-level voltage terminal are separate from a around voltage terminal, which receives the ground voltage.

9. The semiconductor device of claim 8, further comprising a bitline pair voltage setting circuit, which sets the voltage of at least one of the plurality of bitline pairs to a bitline test voltage level.

10. The semiconductor device of claim 8, wherein the odd wordlines alternate with the even wordlines.

11. The semiconductor device of claim 8, further comprising:
    a ground voltage connection unit connected to the ground voltage terminal;
    an odd low-level voltage connection unit connected to the odd low-level voltage terminal; and
    an even low-level voltage connection unit connected to the even low-level voltage terminal.

12. The semiconductor device of claim 8, further comprising a ground voltage connection unit connected to the ground voltage terminal, the odd low-level voltage terminal, and the even low-level voltage terminal upon packaging of the semiconductor device.

13. The semiconductor device of claim 8, wherein the semiconductor device is a static random access memory (SRAM).

* * * * *